(12) United States Patent
Kim

(10) Patent No.: US 6,809,004 B2
(45) Date of Patent: Oct. 26, 2004

(54) METHOD OF FORMING A SHALLOW TRENCH ISOLATION

(75) Inventor: Kyung-Hyun Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 326 days.

(21) Appl. No.: 10/040,523

(22) Filed: Jan. 7, 2002

(65) Prior Publication Data

US 2002/0134754 A1 Sep. 26, 2002

(30) Foreign Application Priority Data

Mar. 20, 2001 (KR) ............................... 2001-14378

(51) Int. Cl.⁷ .............................................. H01L 21/302
(52) U.S. Cl. ..................... 438/424; 438/692; 438/704; 438/749; 438/734; 438/714; 438/696
(58) Field of Search ............................. 438/424, 692, 438/704, 749, 734, 714, 696

(56) References Cited

U.S. PATENT DOCUMENTS

| | | | | |
|---|---|---|---|---|
| 4,024,163 A | | 5/1977 | Elliott et al. | 260/347.4 |
| 6,010,947 A | * | 1/2000 | Kondo | 438/435 |
| 6,030,697 A | | 2/2000 | Samson et al. | 428/221 |
| 6,054,182 A | | 4/2000 | Collins | 427/242 |

FOREIGN PATENT DOCUMENTS

JP          10-032240          3/1998

OTHER PUBLICATIONS

Permethrin ... What Is It? Information from the internet; Jul. 1999.
Literature entitled "Individual Dynamic Absorption (IDA) Kit"; Origin unknown, Oct. 2001.
Literature entitled "Aerosol Spray"; Origin unknown, Oct. 2001.
Literature from Adapco, Inc. obtained from the internet; copyright 2001.
Literature entitled "Balancing System Details For All Water Balanced Open Pocket Rigid and Hydro–Cushion Washer–Extractors"; undated.
Drawing of Drive and Support Shaft Assembly from Milnor; undated.
Product Code 482 information fro 400 Pound Super Saver Tumbler; undated.
Roussel Uclaf–Permanne 40 MFG Conc. For Military Specs; 85095, undated.
Material Safety Data Sheet; undated.

* cited by examiner

*Primary Examiner*—George A. Goudreau
(74) *Attorney, Agent, or Firm*—Mills & Onello, LLP

(57) ABSTRACT

Disclosed is a method for forming a shallow trench isolation. A pad oxide layer is formed on a semiconductor substrate. First and second stopping layers are sequentially formed on the pad oxide layer. The second stopping layer, the first stopping layer, the pad oxide layer and the semiconductor substrate are etched to form a second stopping layer pattern, a first stopping layer pattern, a pad oxide layer pattern and a trench. A trench inner wall oxide layer is formed at an inner surface portion of the trench. A nitride layer liner is formed on a resulted structure. A field oxide layer is formed in the trench. By selectively removing the second stopping layer pattern, the first stopping layer pattern is exposed. Then, the first stopping layer pattern is removed. Since the chemical mechanical polishing is stopped at the second stopping layer pattern, the first stopping layer pattern is prevented from erosion when the chemical mechanical polishing process is carried out. Since the thickness of the first stopping layer pattern is uniformly maintained, the liner dent created at a surface boundary between the active area and the field area is reduced when a phosphoric acid stripping process is carried out.

16 Claims, 9 Drawing Sheets

METHOD OF FORMING A SHALLOW TRENCH ISOLATION

BACKGROUND OF THE INVENTION

1. Field of the Invention

The present invention relates to a method for forming a trench isolation, and more particularly to a method for forming a shallow trench isolation capable of reducing a liner dent.

2. Description of the Related Art

Generally, an isolation structure in semiconductor processing is achieved by performing a thermal field oxidation process, such as a local oxidation of silicon (LOCOS) process. According to the LOCOS process, a pad oxide layer and a nitride layer are sequentially formed on a silicon substrate, and then, the nitride layer is patterned. A field oxide layer is formed by selectively oxidizing the silicon substrate using the patterned nitride layer as an anti-oxidation mask. When the silicon substrate is selectively oxidized, oxygen penetrates into a lateral side of the oxide layer from a lower portion of the nitride layer, which is used as the mask, so a "bird's beak" is created at an end portion of the field oxide layer. Accordingly, the field oxide layer expands towards an active area by a length of the bird's beak, so a width of the active area is reduced, such that the electrical characteristics of the semiconductor device are degraded.

For this reason, a shallow trench isolation (STI) structure was suggested in an ultra large-scale integrated semiconductor device. According to the STI process, a trench is formed by etching a silicon substrate. Then, an oxide layer is deposited to fill the trench. Thereafter, the oxide layer except in the trench is etched away by performing an etch back process or a chemical mechanical polishing (CMP) process, thereby forming a field oxide layer in the trench.

FIGS. 1A to 1D are sectional views showing a method for forming a conventional shallow trench isolation. Referring to FIG. 1A, a pad oxide layer is formed on a silicon substrates 10. Then, a nitride layer and a high temperature oxide layer are sequentially deposited on the pad oxide layer. The nitride layer acts as a stopping layer when a chemical mechanical polishing process is carried out and the high temperature oxide layer acts as a hard mask layer.

Then, silicon oxynitride (SiON) is deposited on the high temperature oxide layer to form an anti-reflective layer (not shown). Then, a photolithography process for defining an active pattern is carried out to form a high temperature layer pattern 16.

A nitride layer pattern 14 and a pad oxide layer pattern 12 are formed by etching the nitride layer and the pad oxide layer using the high temperature oxide layer pattern 16 as an etching mask. Then, an upper portion of the silicon substrate 10 adjacent to the nitride layer pattern 14 is etched to form a trench 18.

In order to cure the damage of silicon caused by an impact of ions having high energy during the trench etching process, an exposed portion of the trench 18 is heat-treated in an oxidation atmosphere. Then, a trench inner wall oxide layer 20 is formed at an inside surface of the trench 18 including a bottom surface and a sidewall of the trench 18 caused by the oxidation reaction between exposed silicon and an oxidant in the oxidation atmosphere. Thereafter, a nitride layer liner 22 is deposited on the resulting structure in order to prevent current from leaking and to improve the characteristic of the gate oxide layer. If necessary, an oxide layer 23 is deposited on the nitride layer liner 22 to prevent the nitride layer liner 22 from being damaged when a gap filling oxide layer is deposited.

Referring to FIG. 1B, after forming the oxide layer 23 through the CVD process so as to fill the trench 18, the CVD-oxide layer 23 is removed by the CMP process until the upper surface of the nitride layer pattern is exposed. As a result, a field oxide layer 24 is formed in the trench 18.

Referring to FIG. 1C, the nitride layer pattern 14 is removed by performing a phosphoric acid stripping process. Generally, the polishing features of the CMP process vary on the basis of size, density and stepped portions of a pattern consisting an under-layer. Accordingly, the amount of polishing of the CVD-oxide layer 23 is varied at each region of the wafer when the CMP process is carried out due to the variation of the density of the active pattern, that is the nitride layer pattern 14, formed under the CVD-oxide layer 23. As a result, not only is the thickness of the nitride layer pattern 14 differently formed, but also the thickness of the field oxide layer 24 is different.

The nitride layer pattern 14 is removed by considering the maximum thickness of the nitride layer pattern 14 when the phosphoric acid stripping process is carried out. At this time, an over etch process is performed to completely remove the nitride layer pattern 14. When the over etch process is carried out, the nitride layer liner 22 formed at the sidewall of the trench 18 is etched by the phosphoric acid so a liner dent (indicated by the symbol "A" in FIG. 1C) is created at a surface boundary between the active area and the field area after the phosphoric acid stripping process has been finished.

FIG. 1D is an enlarged sectional view showing the surface boundary portion A formed between the active area and the field area. FIG. 1D shows a step of forming a gate oxide layer 26 on a surface of the active area after performing a wet cleaning process. The field oxide layer 24 is removed by a thickness of 200 to 500 Å when the stripping process and the cleaning process with respect to the nitride layer pattern 14 are performed. In addition, the liner dent created during the phosphoric acid stripping process grows when the cleaning process is carried out, so a groove G is formed in the field oxide layer 24. The groove G causes leakage current.

In order to solve the above problems, a pull back process for the nitride layer liner has been suggested. Hereinafter, the pull back process will be described with reference to FIGS. 2A to 2F.

Referring to FIG. 2A, a pad oxide layer is formed on a silicon substrate 50. Then, a nitride layer and a high temperature oxide layer are sequentially deposited on the pad oxide layer. The nitride layer acts as a stopping layer when the CMP process is carried out and the high temperature oxide layer acts as a hard mask layer.

Then, silicon oxynitride (SiON) is deposited on the high temperature oxide layer to form an anti-reflective layer (not shown). Thereafter, a photolithography process for defining an active pattern is carried out to form a high temperature layer pattern 56. A nitride layer pattern 54 and a pad oxide layer pattern 52 are formed by etching the nitride layer and the pad oxide layer using the high temperature oxide layer pattern 56 as an etching mask. Then, an upper portion of the silicon substrate 50 adjacent to the nitride layer pattern 54 is etched to form a trench 58. At this time, the critical dimension of a bar of the nitride layer pattern 54 is identical to the critical dimension of an active bar.

Referring to FIG. 2B, the wafer is dipped in phosphoric acid for 6 seconds. Then, the nitride layer pattern 54 is etched in vertical and horizontal directions, so the critical dimension (a) of the bar of the nitride layer pattern 54 becomes smaller than the critical dimension (b) of the active bar.

Referring to FIG. 2C, in order to cure the damage of silicon caused by an impact of ions having high energy during the trench etching process, an exposed portion of the trench 58 is heat-treated in an oxidation atmosphere. Then, a trench inner wall oxide layer 60 is formed at an inside surface of the trench 58 including a bottom surface and a sidewall of the trench 58 caused by the oxidation reaction between exposed silicon and an oxidant in the oxidation atmosphere. Then, a nitride layer liner 62 is deposited on the resulting structure in order to prevent leakage current and to improve the characteristic of the gate oxide layer.

Referring to FIG. 2D, after forming the oxide layer 63 through the CVD process to fill the trench 58, the CVD-oxide layer 63 except in the trench 58 is removed by the CMP process until the upper surface of the nitride layer pattern 54 is exposed. As a result, a field oxide layer 64 is formed in the trench 58.

Referring to FIG. 2E, the nitride layer pattern 54 is removed by performing a phosphoric acid stripping process.

Referring to FIG. 2F, after chemically cleaning the semiconductor substrate, a gate oxide layer 66 is formed on a surface of an active area. The field oxide layer 64 is removed by a thickness of 200 to 500 Å when the stripping process and the cleaning process with respect to the nitride layer pattern 54 is performed.

According to the pull back process of the nitride layer liner, a phosphoric acid stripping process is carried out in a state that the nitride layer liner 62 is transversely formed on the active area by the difference of the critical dimensions between the active bar and the bar of the nitride layer pattern 54. Therefore, the nitride layer liner formed on the active area is etched when the phosphoric acid process is carried out, but the nitride layer liner formed at the sidewall of the trench 58 is not etched. Accordingly, the liner dent is reduced at the surface boundary between the active area and the field area. However, the liner pull back process causes the nitride layer pattern 54 to have an uneven thickness, so the liner dent cannot be completely removed by the pull back process. In addition, since the size of the nitride layer pattern 54 decreases through a phosphoric acid dipping process, the size of the active area is reduced.

SUMMARY OF THE INVENTION

The present invention has been made to solve the above problems of the prior art. Accordingly, t is an object of the present invention to provide a method for forming a shallow trench isolation capable of preventing a liner dent.

In accordance with the invention, there is provided a method for forming a shallow trench isolation. In accordance with the method of the invention, a pad oxide layer is formed on a semiconductor substrate, and a first stopping layer is formed on the pad oxide layer. A second stopping layer is formed on the first stopping layer. The second stopping layer, the first stopping layer, the pad oxide layer and the semiconductor substrate are etched to form a second stopping layer pattern, a first stopping layer pattern, a pad oxide layer pattern and a trench. A trench inner surface oxide layer is formed at an inner surface portion of the trench. A nitride layer liner is formed on the resulting structure, and a field oxide layer is formed in the trench. The second stopping layer pattern is selectively removed to thereby expose the first stopping layer pattern, and then the first stopping layer pattern is removed.

According to another embodiment of the present invention, there is provided a method for forming a shallow trench isolation. In accordance with the method, a pad oxide layer is formed on a semiconductor substrate, and a first stopping layer is formed on the pad oxide layer. A second stopping layer is formed on the first stopping layer, the second stopping layer including a material having a selectivity with respect to a material of first stopping layer in a predetermined etching process. The second stopping layer, the first stopping layer, the pad oxide layer and the semiconductor substrate are partially etched to form a second stopping layer pattern, a first stopping layer pattern, a pad oxide layer pattern and a trench. A trench inner wall oxide layer is formed at an inner surface portion of the trench, and a nitride layer liner is formed on the resulting structure. A gap filling oxide layer is formed so as to fill the trench. The gap filling oxide layer is removed by performing a chemical mechanical polishing process until a surface of the second stopping layer pattern is exposed. The second stopping layer pattern is selectively removed to expose the first stopping layer pattern, and then the first stopping layer pattern is removed.

In one embodiment, the first stopping layer includes nitride. The second stopping layer can include a material having a selectivity to a gap filling oxide layer which fills up the trench to form the field oxide layer in a chemical mechanical polishing process so that an etching rate of the gap filling oxide layer with respect to the second stopping layer is no less than about 10:1. In one embodiment, the second stopping layer includes at least one of silicon oxynitride (SiON) and polysilicon.

In one embodiment, the second stopping layer pattern can be removed by performing a dry etching process. The second stopping layer can alternatively be removed by performing a wet etching process using a chemical having a selectivity more than 10:1 between the second and first stopping layers. In this embodiment, when the second stopping layer includes silicon oxynitride, the second stopping layer pattern is selectively removed using a mixture including $H_2O_2$, HF, and deionized water. In this embodiment, when the second stopping layer includes polysilicon, the second stopping layer pattern can be selectively removed using a polysilicon etchant.

In one embodiment, the first stopping layer pattern can be removed by performing a wet etching process.

In one embodiment, forming a gap filling oxide layer to fill the trench includes forming the gap filling oxide layer to fill the trench and removing the gap filling oxide layer until a surface of the second stopping layer pattern is exposed by performing a chemical mechanical polishing process.

According to the preferred embodiment of the present invention, the stopping layer for the chemical mechanical process is changed from a single stopping layer to a dual stopping layer. In addition, the second stopping layer is formed using a material having a high selectivity with respect to a gap filling oxide layer for the chemical mechanical polishing process so that the etching rate ratio of the gap filling oxide layer with respect to the second stopping layer is more than about 10:1 in the chemical mechanical polishing process. After forming the field oxide layer by performing the CMP process, the second stopping layer pattern is selectively removed using chemical having a selectivity to the first stopping layer or to the nitride layer liner.

Since the chemical mechanical polishing is stopped at the second stopping layer pattern, the first stopping layer pattern is prevented from erosion when the chemical mechanical polishing process is carried out. Since the thickness of the first stopping layer pattern is uniformly maintained, the over etching time is greatly reduced when the phosphoric acid stripping process is carried out, so the nitride layer liner formed at a sidewall of the trench is barely etched. Therefore, the liner dent created at a surface boundary between the active area and the field area is reduced.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Hereinafter, preferred embodiments of the present invention will be described in detail with reference to accompanying drawings.

FIGS. 3A to 3H are sectional views showing a method for forming a shallow trench isolation according to one embodiment of the present invention.

Figure 1A:
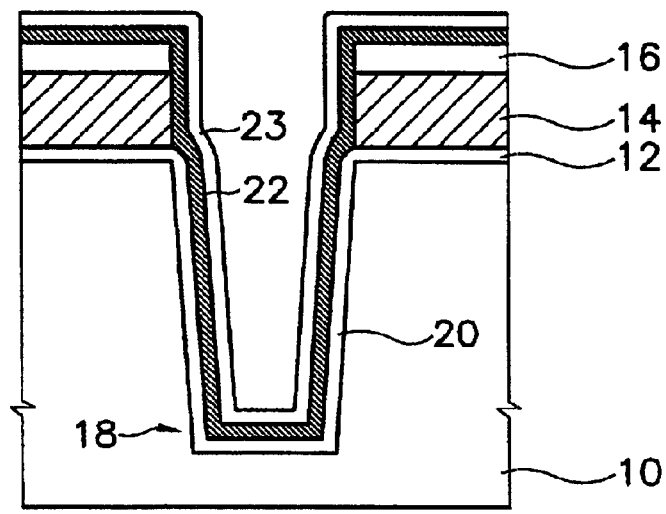
FIGS. 1A to 1D are sectional views showing a conventional method for forming a shallow trench isolation.
Figure 1B:
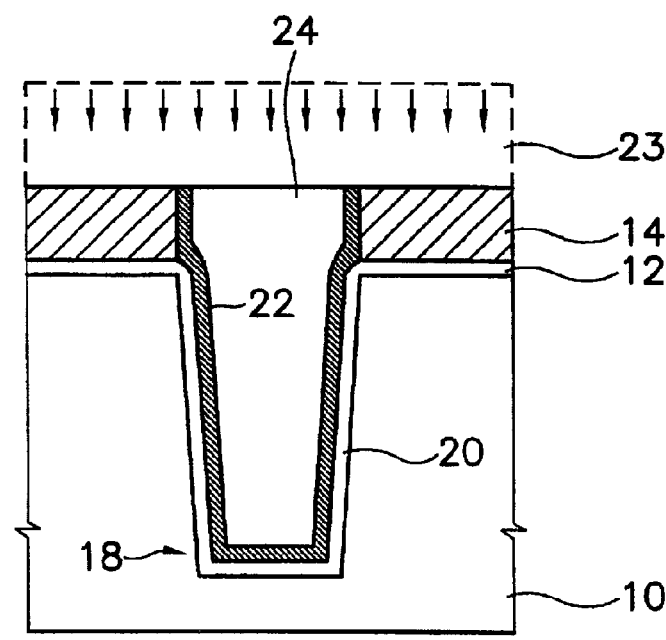
Figure 1C:
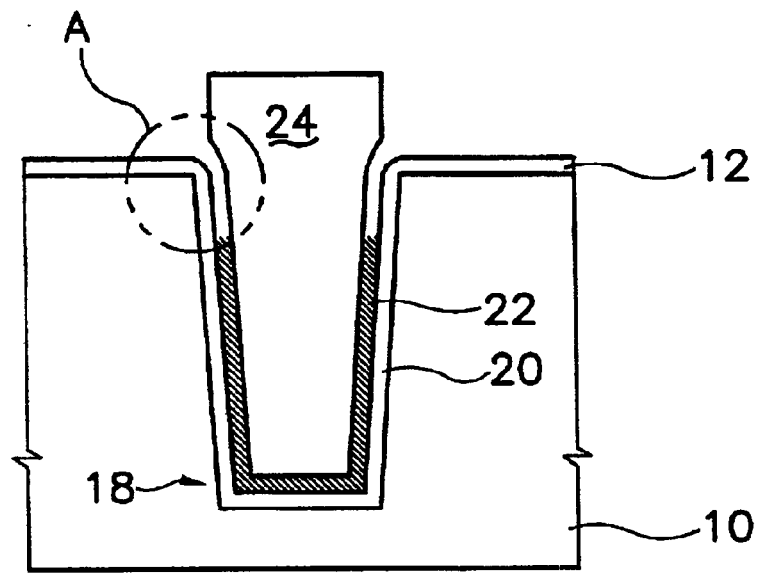
Figure 1D:
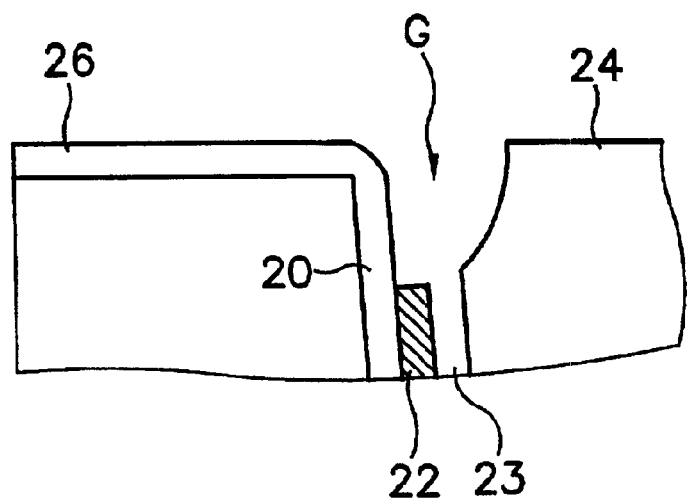
Figure 2A:
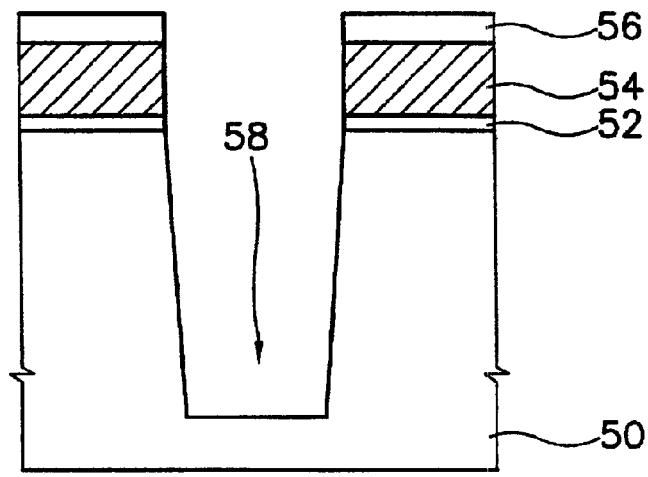
FIGS. 2A to 2F are sectional views showing another conventional method for forming a shallow trench isolation.
Figure 2B:
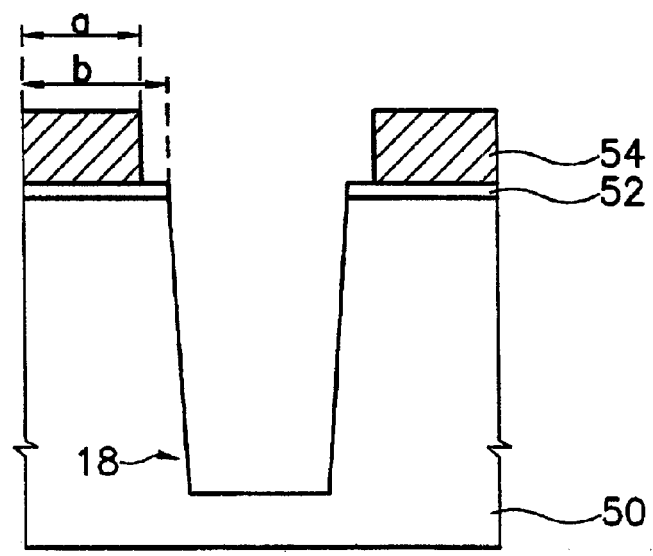
Figure 2C:
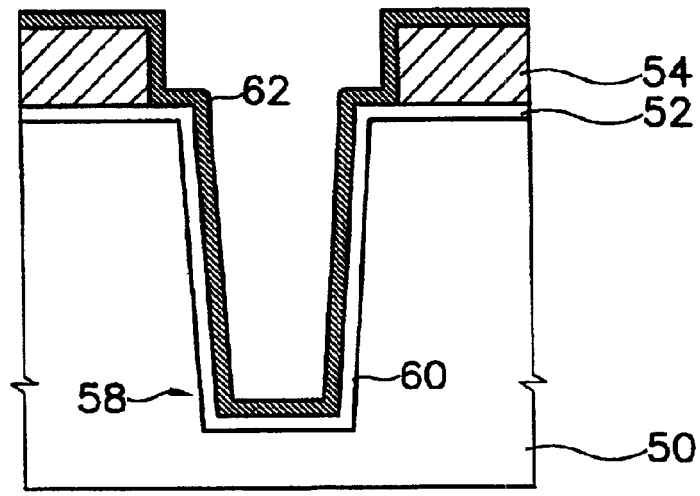
Figure 2D:
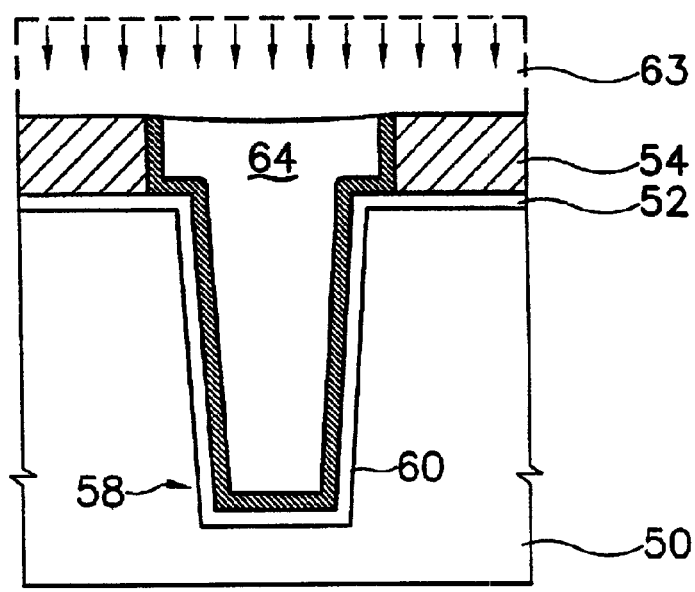
Figure 2E:
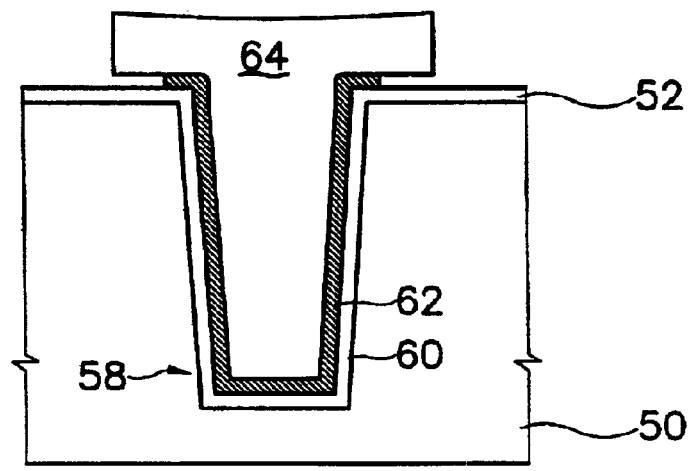
Figure 2F:
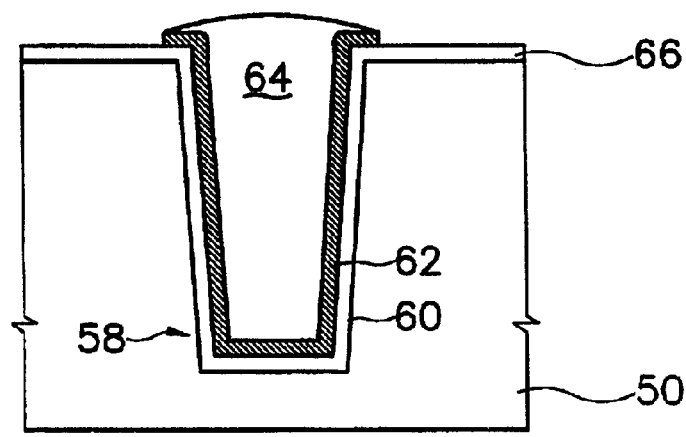
Figure 3A:
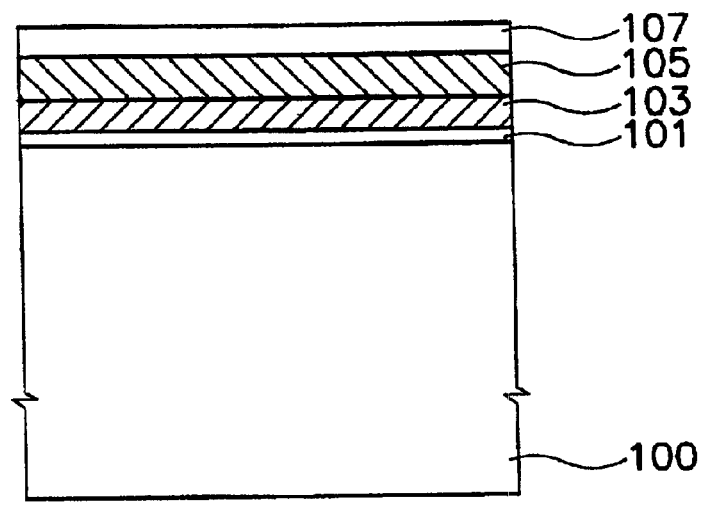
FIGS. 3A to 3H are sectional views showing a method for forming a shallow trench isolation according to one embodiment of the present invention.

Referring to FIG. 3A, a pad oxide layer 101 is formed on a semiconductor substrate 100, such as a silicon substrate, to a thickness of about 100 to 200 Å through a thermal oxidation process. Then, a first stopping layer 103 is formed by depositing a nitride layer on the pad oxide layer 101 to a thickness about 100 to 200 Å through a low pressure chemical vapor deposition (LPCVD) process. The first stopping layer 103 acts as a polishing stopping layer when a chemical mechanical polishing (CMP) process is carried out.

A second stopping layer 105 is formed by depositing a material on the first stopping layer 103 to a thickness about 100 to 1000 Å. The material 105 has a high selectivity with respect to a gap filling oxide layer for the chemical mechanical polishing process so that the etching rate ratio of the gap filling oxide layer with respect to the second stopping layer is more than about 10:1 in the chemical mechanical polishing process. The second stopping layer 105 acts as a polishing stopping layer when the CMP process is carried out. The second stopping layer 105 has a high selectivity to the first stopping layer 103 or to the nitride layer liner for the wet or dry etching process. Preferably, the first stopping layer 103 is comprised of silicon nitride (SiN), and the second stopping layer is comprised of silicon oxynitride (SiON) or polysilicon.

Thereafter, a hard mask layer 107 is formed by depositing a high temperature oxide layer on the second stopping layer 105 to a thickness about 50 to 1000 Å through the LPCVD process. Then, silicon oxynitride (SiON) is deposited on the hard mask layer 107 to a thickness about 200 to 800 Å through the LPCVD process, thereby forming an antireflective layer (not shown). The anti-reflective layer prevents the diffused reflection of light when a photo process is carried out, and is removed when the trench forming process is carried out.

Figure 3B:
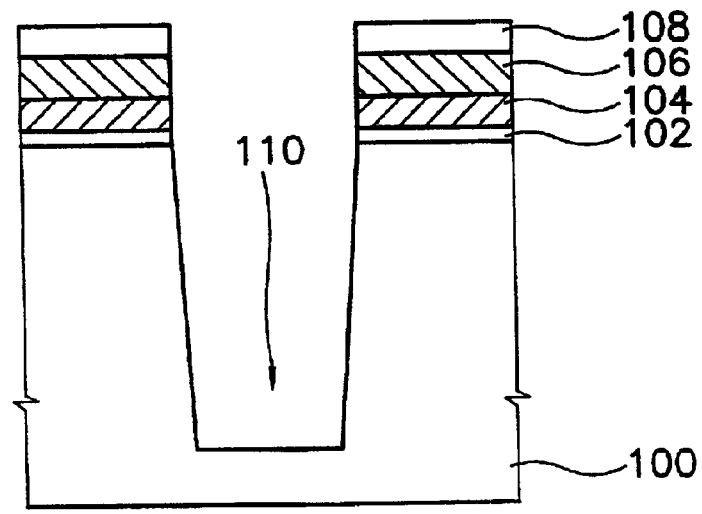

Referring to FIG. 3B, a hard mask pattern 108 is formed by dry etching the antireflective layer and the hard mask layer 107 by means of a photolithography process for forming an active pattern. Then, the second stopping layer 105, the first stopping layer 103, and the pad oxide layer 101 are dry etched using the hard mask pattern 108 as an etching mask, thereby forming a second stopping layer pattern 106, a first stopping layer pattern 104 and a pad oxide layer pattern 102. Then, a trench 110 is formed by etching the exposed semiconductor substrate 100 to a depth of about 2000 to 5000 Å using the hard mask pattern 108. At this time, the anti-reflective layer is removed and the hard mask pattern 108 is etched by a predetermined thickness.

Figure 3C:
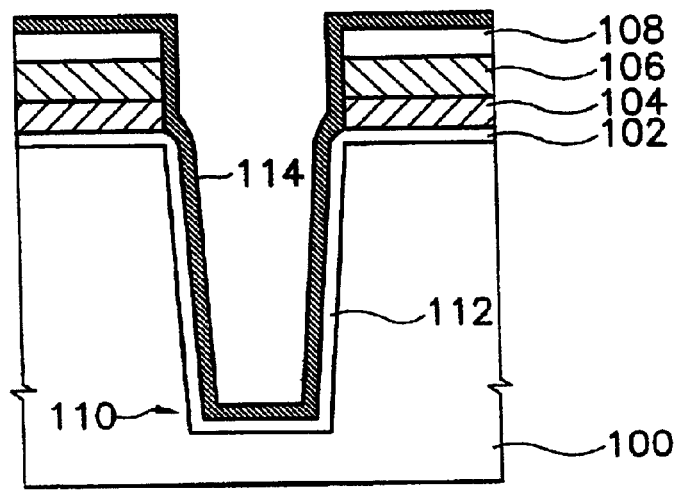

Referring to FIG. 3C, in order to cure the damage of silicon caused by an impact of ions having high energy during the trench etching process, an exposed surface portion of the trench 110 is heat-treated in an oxidation atmosphere. Then, a trench inner wall oxide layer 112 having a thickness about 20 to 300 Å is formed on an inner surface portion of the trench 110 including a bottom surface and a sidewall of the trench 110 caused by the oxidation reaction between exposed silicon and an oxidant in the oxidation atmosphere.

A nitride layer liner 114 is deposited on the entire surface of the resulting structure to a thickness about 30 to 200 Å through the LPCVD process in order to prevent the impurities, such as carbon C or hydrogen H, from diffusing into the edge of the active area from layers deposited during the subsequent processes, such as the gap filling oxide layer or a capping oxide layer, thereby preventing current leakage and improving the characteristics of the gate oxide layer. If necessary, in order to prevent the nitride layer liner 114 from being damaged, an oxide layer (not shown) may be deposited on the nitride layer liner 114 to a thickness about 100 Å at the temperature of 700 to 750° C., when the gap filling oxide layer is deposited.

Figure 3D:
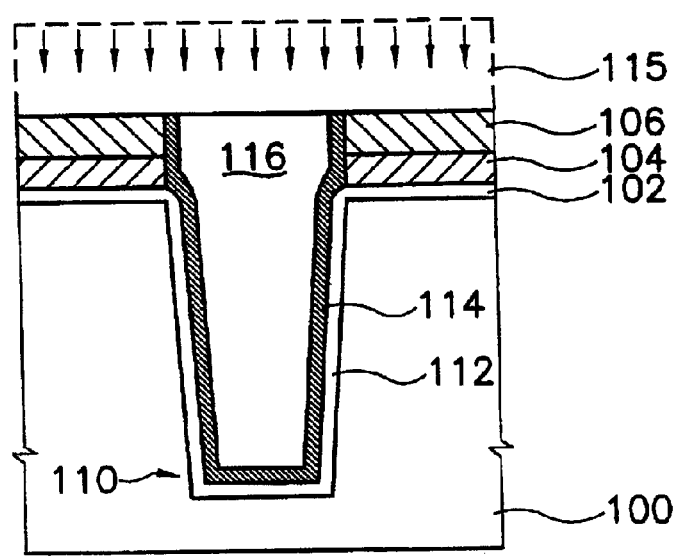

Referring to FIG. 3D, an oxide layer having a superior gap filling characteristics, such as an undoped silicate glass (USG) layer, an $O_3$-TEOS USG layer, or a high density plasma (HDP) oxide layer, is deposited to a thickness about 5000 Å through the CVD process such that the trench 118 is filled by the oxide layer, thereby forming the gap filling oxide layer 115. Preferably, the HDP oxide layer is formed by generating the high-density plasma. $SiH_4$, $O_2$, and Ar gases can be used as plasma source gases.

A capping oxide layer (not shown) comprising PE-TEOS may be deposited on the gap filling oxide layer 115 by generating the plasma using $Si(OC_2H_5)_4$ as a source material. If necessary, an annealing process can be carried out in an inert gas atmosphere at a high temperature of 800 to 1050° C. so as to densify the gap filling oxide layer 115, thereby lowering a wet etching rate with respect to the following cleaning process.

Then, the gap filling oxide layer 115 is removed by performing the CMP process until an upper surface of the second stopping layer pattern 106 is exposed, thereby forming a planar field oxide layer 124 in the trench 110.

If the second stopping layer pattern 106 comprises PE-SiON, the second stopping layer pattern 106 has a high selectivity with respect to the gap filling oxide layer 115 with respect to a predetermined slurry which is used for the CMP process so that an etching rate ratio of the gap filling oxide layer 115 and the second stopping layer pattern 106 is no less than 10:1. In addition, the second stopping layer pattern 106 has a high selectivity as compared with the oxide layer and the nitride layer so that an etching rate ratio of the oxide layer and the nitride layer with respect to the second stopping layer pattern 106 is no less than 20:1 when the subsequent wet etching process is carried out.

When the second stopping layer 106 comprises polysilicon, the second stopping layer 106 has a high selectivity so that the etching rate ratio of the second stopping layer 106 with respect to the oxide layer and the nitride layer is no less than 10:1 for the CMP process. In addition, the second stopping layer pattern 106 has a high selectivity so that the etching rate ratio of the second stopping layer 106 with respect to the oxide layer and the nitride layer is no less than 10:1 when the subsequent wet etching process is carried out.

Figure 3E:
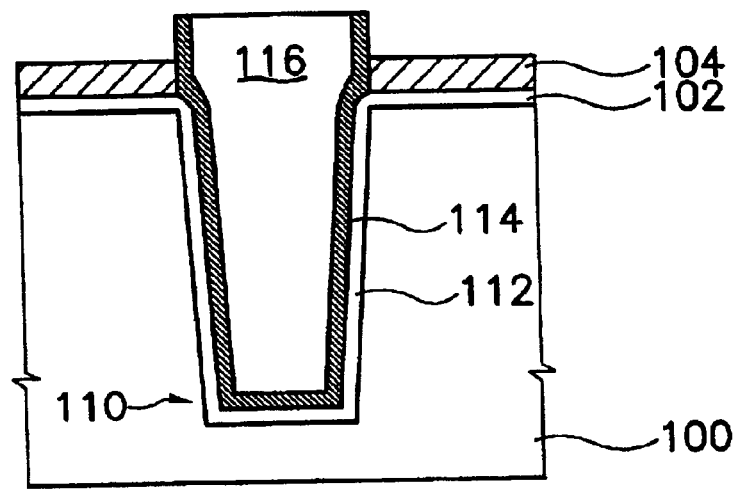

Referring to FIG. 3E, the first stopping layer pattern 104 is exposed by selectively removing the second stopping layer pattern 106 through the wet etching or dry etching process. Preferably, the second stopping layer pattern 106 is removed by performing the wet etching process using a chemical having an etching selectivity more than 10:1 between the second stopping layer 106 and the first stopping layer 104. If the second stopping layer pattern 106 comprises PE-SiON, the second stopping layer pattern 106 is selectively removed by using a mixture including $H_2O_2$, HF, and deionized water. In addition, if the second stopping layer pattern 106 comprises polysilicon, the second stopping layer pattern 106 is selectively removed by using a polysilicon etchant.

When the chemical for removing the second stopping layer pattern 106 does not etch the first stopping layer pattern 104 which comprises nitride, as shown in FIG. 3E, the nitride liner 114 remains between the second stopping layer pattern 106 and the field oxide layer 116, that is, at the sidewall of the field oxide layer 116.

Figure 3F:
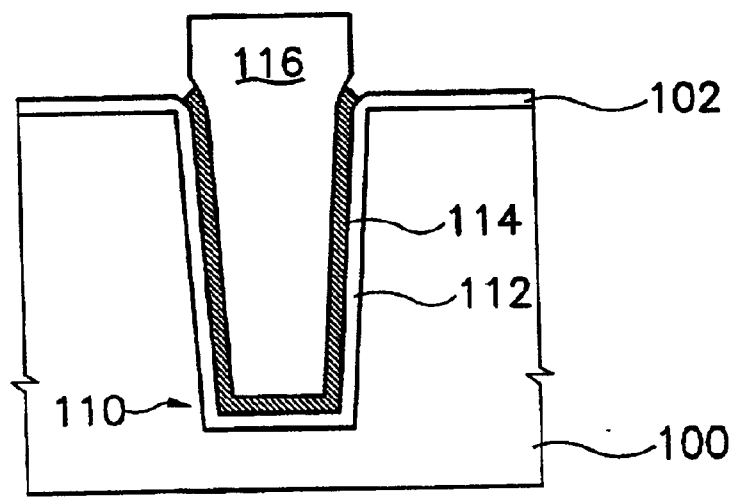

Referring to FIG. 3F, the first stopping layer pattern 104 is removed through a phosphoric acid stripping process. At this time, an over etch process is carried out so as to completely remove the first stopping layer pattern 104.

Figure 3G:
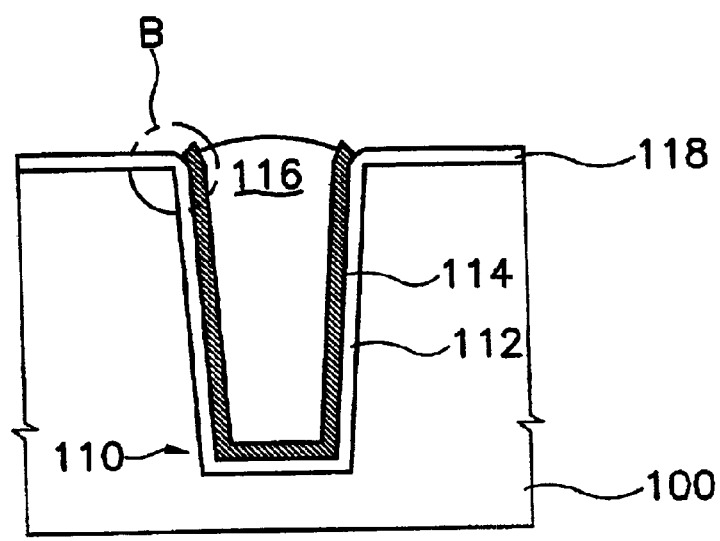

According to the preferred embodiment of the present invention, when the nitride layer liner 114 remains at the sidewall of the field oxide layer 116, the nitride layer liner 114 formed at the exposed sidewall of the field oxide layer 116 is etched when the phosphoric acid stripping process is carried out, but the nitride layer liner 114 formed at the sidewall of the trench 110 is not etched (refer to B in FIG. 3G). Accordingly, the liner dent is not created at a surface boundary between the active area and the field area.

In addition, even when the nitride layer liner 114 does not exist at the sidewall of the field oxide layer because the chemical for removing the second stopping layer pattern 106 also etches the first stopping layer pattern 104, the probability for generating the liner dent is very low. That is, since the CMP process for forming the field oxide layer 116 is stopped at the surface of the second stopping layer pattern 106, the first stopping layer pattern 104 is prevented from erosion when the CMP process is carried out, so the thickness of the first stopping layer pattern 104 uniformly remains. In addition, since the present invention adopts the stopping layer having a dual layer structure, the thickness of the first stopping layer pattern 104 is thinner than the thickness of the conventional stopping layer having a single layer structure. Therefore, since the thickness of the first stopping layer pattern 104, to which the phosphoric acid stripping process is carried out, is thin and uniform, the over etching time is greatly reduced when the phosphoric acid stripping process is performed. As a result, the wet etching time is greatly reduced, so the nitride liner 114 formed at the sidewall of the trench 110 is rarely etched.

Referring to FIG. 3G, after chemically cleaning the semiconductor substrate, the gate oxide layer 118 is formed on the surface of the active area. The field oxide layer 116 is consumed by a thickness about 200 to 500 Å due to the stripping process and the cleaning process.

Figure 3H:
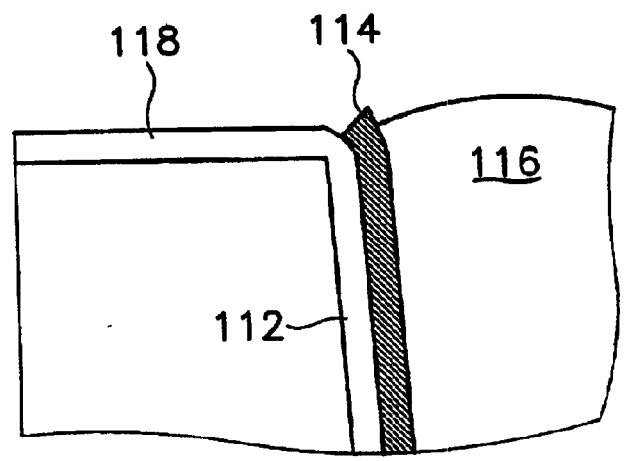

FIG. 3H is an enlarged sectional view of the portion "B" shown in FIG. 3G, in which the liner dent is not created at the surface boundary formed between the active area and the field area.

As described above, according to the present invention, the stopping layer for the CMP process is changed from a single layer structure to a dual layer structure and an upper stopping layer (that is, the second stopping layer) thereof is formed using a material having a high selectivity with respect to the gap filling oxide layer for the CMP process so that the etching rate ratio of the gap filling oxide layer with respect to the upper stopping layer is no less than 10:1. After forming the field oxide layer through the CMP process, the upper stopping layer is selectively removed using a chemical having selectivity to a lower stopping layer (that is, the first stopping layer) or to the nitride layer liner.

Since the CMP process is stopped at the second stopping layer, the first stopping layer is prevented from erosion when the CMP process is carried out. Therefore, the thickness of the first stopping layer is uniformly maintained, so the over etching time is greatly reduced when the phosphoric acid stripping process is performed. Accordingly, the nitride layer liner formed at the sidewall of the trench is rarely etched, so that the liner dent is reduced at the surface boundary formed between the active area and the field area.

In addition, when the chemical, which does not etch the first stopping layer or the nitride layer liner, is used, the nitride layer liner remains between the second stopping layer and the field oxide layer when the second stopping layer is selectively removed. Therefore, when the phosphoric acid stripping process is carried out with respect to the first stopping layer, the nitride layer liner formed at the sidewall of the field oxide layer is removed, but the nitride layer liner formed at the sidewall of the trench is not etched. Accordingly, the process margin for the liner dent is greatly increased.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A method for forming a shallow trench isolation, the method comprising:

i) forming a pad oxide layer on a semiconductor substrate;

ii) forming a first stopping layer on the pad oxide layer, the first stopping layer comprising nitride;

iii) forming a second stopping layer on the first stopping layer;

iv) etching the second stopping layer, the first stopping layer, the pad oxide layer and the semiconductor substrate to thereby form a second stopping layer pattern, a first stopping layer pattern, a pad oxide, layer pattern and a trench;

v) forming a trench inner surface oxide layer at an inner surface portion of the trench;

vi) forming a nitride layer liner on a resulting structure;

vii) forming a field oxide layer in the trench;

viii) selectively removing the second stopping layer pattern thereby exposing the first stopping layer pattern; and ix) removing the first stopping layer pattern.

2. The method as claimed in claim 1, wherein the second stopping layer comprises a material having a selectivity to a gap filling oxide layer which fills up the trench for forming the field oxide layer in a chemical mechanical polishing process so that an etching rate ratio of the gap filling oxide layer with respect to second stopping layer is no less than about 10:1.

3. The method as claimed in claim 2, wherein the second stopping layer comprises at least one of silicon oxynitride (SiON) and polysilicon.

4. The method as claimed in claim 1, wherein the second stopping layer pattern is removed by performing a dry etching process.

5. The method as claimed in claim 1, wherein the second stopping layer pattern is removed by performing a wet etching process using a chemical having a selectivity more than 10:1 between the second and first stopping layers.

6. The method as claimed in claim 5, wherein the second stopping layer includes silicon oxynitride, the second stopping layer pattern is selectively removed by using a mixture including $H_2O_2$, HF, and deionized water.

7. The method as claimed in claim 5, wherein when the second stopping layer includes polysilicon, the second stopping layer pattern is selectively removed by using a polysilicon etchant.

8. The method as claimed in claim 1, wherein the first stopping layer pattern is removed by performing a wet etching process.

9. The method as claimed in claim 1, wherein step vii) comprises the substeps of forming a gap filling oxide layer to fill the trench and removing the gap filling oxide layer until a surface of the second stopping layer pattern is exposed by performing a chemical mechanical polishing process.

10. A method for forming a shallow trench isolation, the method comprising the steps of:

i) forming a pad oxide layer on a semiconductor substrate;

ii) forming a first stopping layer on the pad oxide layer, the first stopping layer comprising nitride;

iii) forming a second stopping layer on the first stopping layer, the second stopping layer including a material having a selectivity to a material forming the first stopping layer with respect to a predetermined etching process, the second stopping layer including at least one of silicon oxynitride (SiON) and polysilicon;

iv) etching the second stopping layer, the first stopping layer, the pad oxide layer and the semiconductor substrate thereby forming a second stopping layer pattern, a first stopping layer pattern, a pad oxide layer pattern and a trench;

v) forming a trench inner wall oxide layer at an inner surface portion of the trench;

vi) forming a nitride layer liner on a resulting structure;

vii) forming a gap filling oxide layer to fill the trench;

viii) removing the gap filling oxide layer until a surface of the second stopping layer pattern is exposed by performing a chemical mechanical polishing process;

ix) selectively removing the second stopping layer pattern thereby exposing the first stopping layer pattern; and x) removing the first stopping layer pattern.

11. The method as claimed in claim 10, wherein the second stopping layer comprises a material having a selectivity to a gap filling oxide layer which fills up the trench for forming the field oxide layer in a chemical mechanical polishing process so that an etching rate ratio of the gap filling oxide layer with respect to second stopping layer is no less than about 10:1.

12. The method as claimed in claim 10, wherein the second stopping layer pattern is removed by performing a dry etching process.

13. The method as claimed in claim 10, wherein the second stopping layer pattern is removed by performing a wet etching process using a chemical having a selectivity more than 10:1 between the second and first stopping layers.

14. The method as claimed in claim 13, wherein, when the second stopping layer includes silicon oxynitride, the second stopping layer pattern is selectively removed by using a mixture including $H_2O_2$, HF, and deionized water.

15. The method as claimed in claim 13, wherein, when the second stopping layer includes polysilicon, the second stopping layer pattern is selectively removed by using a polysilicon etchant.

16. The method as claimed in claim 10, Wherein the first stopping layer pattern is removed by performing a wet etching process.

* * * * *